April 1, 1969 R. A. RUSSELL ET AL 3,436,669

NARROW BAND AMPLIFIERS USING DISTRIBUTED RC NETWORK

Filed Jan. 26, 1967

INVENTORS
RICHARD A. RUSSELL
DONALD W. LEWIS

BY D. Gordon Angus
ATTORNEY

United States Patent Office 3,436,669

Patented Apr. 1, 1969

3,436,669

NARROW BAND AMPLIFIERS USING DISTRIBUTED RC NETWORK

Richard A. Russell, Pomona, and Donald W. Lewis, Duarte, Calif., assignors to Aerojet-General Corporation, El Monte, Calif., a corporation of Ohio Filed Jan. 26, 1967, Ser. No. 611,946
Int. Cl. H03f 3/04, 3/68
U.S. Cl. 330—21 7 Claims

ABSTRACT OF THE DISCLOSURE

The present invention relates to narrow band amplifiers, and particularly to narrow band amplifiers utilizing a distributed parameter network.

A narrow band amplifier according to the pesent invention comprises a differential amplifier means having two inputs and an output. A distributed network having narrow band attenuation characteristics interrelates the output and one of the inputs in negative feedback relationship so that the gain of the amplifier is at a maximum at the center frequency of the narrow band and signals at center frequency appearing at the other input are maximally amplified.

The present invention pertains generally to narrow band amplifiers, and more particularly to narrow band amplifiers utilizing a distributed parameter network.

There are many electronic applications in which a narrow band amplifier is highly useful or necessary, such as, for example, in a radio receiver that requires selective amplification of high frequency electrical signals. Frequency selectivity has been conventionally obtained in electronic systems by the use of LC (inductor-capacitor) tuned circuits. However, when a frequency selective amplifier, or filter circuit, is constructed from solid state materials, either thin-film, hybrid or monolithic, the use of LC tuned circuits is precluded from a practical standpoint in many cases. This is true because suitable small size inductors of the required ranges of inductance have not yet been devised for use in microelectronic applications. Unless space and weight requirements permit the use of conventional sized inductors, other means and techniques must be adopted to obtain the desired effects.

Various alternatives to the use of inductance are available in the communications art, such as a Wien bridge, twin-T and bridged-T null networks. However, for use in microelectronic circuits, RC circuits are an especially advantageous solution, since resistors and capacitors are readily produced by microelectronic fabrication techniques over a wide range of values. It is particularly in connection with this type of circuit that the present invention pertains and by the techniques of which the special RC distributed parameter network of the invention is fabricated.

It is, therefore, a primary object of the invention to provide a narrow band amplifier for operation with high frequency range signals.

Another object of the invention is to provide a high frequency, narrow band amplifier incorporating a distributed parameter network.

A still further object of the invention is the provision of a narrow band amplifier as described in the above objects wherein the distributed network is of thin-film construction.

Another object is the provision of an amplifier in accordance with the above objects not requiring alignment since the thin-film circuits are formed to a desired predetermined frequency at the time of deposition.

Yet another object of the invention is the provision of a high frequency, narrow band amplifier that is nonmicrophonic and does not require magnetic shielding as a result of the elimination of inductive components.

Another object of the invention is the provision of a high frequency, narrow band amplifier incorporating a distributed network in a negative feedback path permitting wire component and active device parameter variations in the circuit.

Other objects and many of the attendant advantages of this invention will be readily appreciated as the same become better understood by reference to the following detailed description when considered in connection with the accompanying drawings wherein.

Figures 1A, 1B, 2, 3, 4, 5:
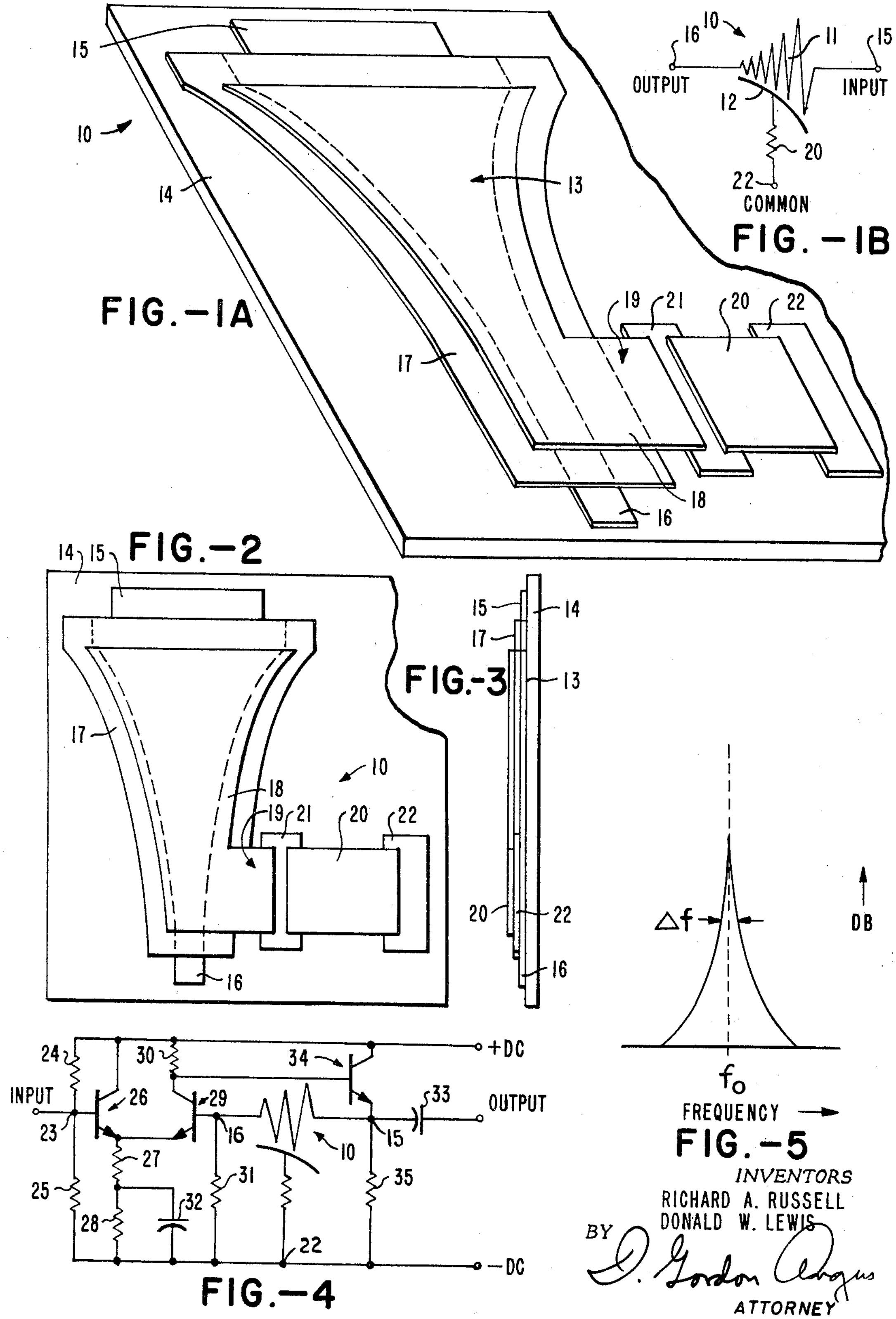
FIG. 1A is a perspective, greatly enlarged view of a thin-film distributed parameter network for use in the amplifier circuit of the invention.
FIG. 1B is a schematic electrical equivalence representation of the network of FIG. 1A.
FIG. 2 is a top elevation of the distributed parameter network of FIG. 1A.
FIG. 3 is a side elevation of the distributed parameter network of FIGS. 1A and 2.
FIG. 4 is a schematic circuit diagram of a high frequency, narrow band amplifier according to this invention.
FIG. 5 is a graph depicting operation of the amplifier of FIG. 4 over a specified frequency spectrum.

It is basic to this invention to avoid the use of inductors in a microelectronic circuit through the utilization of distributed parameter networks of a particular construction. In FIG. 1A there is illustrated a special distributed parameter network 10 having the electrical characteristics shown in the schematic FIG. 1B, namely, a tapered resistance 11 and a distributed capacitor 12 in parallel therewith. The term "distributed network" as used herein means an RC network which includes a resistor and a capacitor whose capacitance is distributed along the length of the resistor in such a manner as to provide incrementally different capacitance along each increment of resistor. Structurally, the network includes a thin film 13 of distributed electrical resistance material deposited on a suitable insulative substrate 14. The width of this thin-film resistor varies exponentially from a maximum at one end to a minimum at the opposite end. There are provided suitable deposited terminal connection means 15 at the larger end and terminal connection means 16 at the smaller end. The resistance film 13 and associated connection means comprise the tapered resistor 11 of FIG. 1B.

Insulative substrate 14 may, for example, be constructed from glass, and may serve as a substrate base for depositing films of material to form other circuit components for an operative circuit. By way of example, substrate 14 may support network 10 and all thin-film resistors and capacitors illustrated in FIG. 4.

The term "thin film" as used herein means a film of material which has been deposited on another material by evaporation or cathode sputtering techniques, and is commercially of the order of less than one micron thick. It is to be understood that although the present invention is described using a thin-film network, the network may be constructed by thick-film techniques, such as by brushing each film on, and may have layers thicker than one micron.

Although any of a number of suitable materials may be used for the resistance film, best results have been obtained to this time with the binary and ternary metal-semiconductor materials described in copending patent application "Metal Semiconductor Alloys for Thin Film Resistors" by Robert P. Mandal, Ser. No. 582,499, assigned to the same assignee as the present application.

Suitable metal-semiconductor materials, as described in the said Mandal application, include: 41.7% by wegiht chromium and 58.3% by weight germanium; 26.4% by weight chromium and 73.6% by weight germanium; 14.8% by weight chromium, 82.9% by weight germanium and 2.3% by weight iron; and 80.8% by weight zirconium and 19.2% by weight boron. Also, a number of materials are presently available for making satisfactory deposited terminal connection means 15 and 16, e.g., thin films of gold of thickness in the order of several thousands of angstroms thick.

A layer of dielectric material 17 is deposited over the upper, or outwardly directed, major surface of the resistor film 13, and in overlapping relationship. Although any number of suitable materials may be used for the dielectric film, best results have been obtained to this date with a dielectric film formed of SiO and $SiO_2$ as described in copending patent application "Dielectric Material and Process," by Mortimer Penberg, Ser. No. 591,780, and assigned to the same assignee as the present application. The dielectric layer is deposited short of the connection means 15 and 16, leaving them exposed for subsequent circuit connection. Finally, a metallic film 18 of similar geometry to that of the resistor film 13 is deposited onto the outer surface of the dielectric layer 17 and in substantial registry with the resistor film, the exponentially curved edges of the metal film being symmetrically arranged to those of the resistor film although uniformly extending slightly beyond them. Adjacent the narrow end of the metallic film there is provided an extension 19 for being connected to the remainder of the circuit in a manner that will be shown.

Relating the structure described to this point to its electrical equivalent circuit of FIG. 1B, the thin-film resistor 13 corresponds to the tapered electrical resistor 11, and its connection means 15 and 16 are similarly labelled in the schematic. The capacitor 12 is made up of the metallic film 18 with the other electrode being provided by the exponentially tapered resistor film 13.

Also considered an interal part of the thin-film distributed network 10 is a resistor 20, shown schematically in FIG. 1B and in perspective in FIG. 1A. Connection of the resistor film 20 with the film 18 is effected via an interconnection pad 21, and to other portions of the circuit to be described later through a termination pad 22.

Wide variation in dimensions of the componental distributed parameter network films is possible providing networks of a considerable variety of electrical characteristics. A network of the kind described and which attenuated signal frequencies in the immediate range of 9.76 megacycles per second had the following specifications:

Thin-film resistor 13 ...2300 ohms.
Dielectric film 17 ....3000 angstroms thick of dielectric material having a constant $k=5$.
Capacitor 12 ........102 picofarads.
Resistor 20 ..........Approximately 40 ohms.

In FIG. 4 a circuit schematic of the preferred form of a narrow band amplifier is illustrated comprising a solid-state differential input, negative feedback amplifier in which the special distributed network already described is arranged in the feedback path. Input for the amplifier is provided at the common connection point 23 of serially arranged resistors 24 and 25 which collectviely form a voltage divider for biasing NPN transistor 26. Input signals are also fed directly to the base of the transistor 26 which is operated as an emitter follower with a pair of serially arranged resistors 27 and 28 interconnecting the emitter of the transistor to the free end of resistor 25. The latter connection point is connected to a source of negative potential at —D.C. The collector of transistor 26 is electrically connected to voltage divider resistor 24 and to the positive side of the source at +D.C.

A second NPN transistor 29 has its emitter directly connected to the emitter of transistor 26, its collector connected via load resistor 30 to +D.C., and its base connected through a biasing resistor 31 to —D.C. In order to prevent degeneration in the emitter circuit of transistor 29, a capacitor 32 provides a low impedance path to signals of frequencies above 1 megacycle per second from the common connection of resistors 27 and 28. The base of transistor 29 is also connected to one of the resistance terminals of the special distributed parameter network 10, or, more exactly, the terminal corresponding to the connection means 16, and the other resistance terminal (connection means 15) is connected via a D.C. blocking capacitor 33 to form the output for the circuit. The distributed network resistance with resistor 31 provides a bias on the base of transistor 29. The capacitor electrode of the distributed network is electrically connected through the resistor 30 to —D.C.

The emitter of a third NPN transistor 34 is connected to the common point of the blocking capacitor 33 and the distributed network resistor and also via a load resistor 35 to —D.C. The collector of transistor 34 is electrically connected to +D.C., while the base is connected to the collector of transistor 29.

In operation, an input signal to the base of transistor 26 will see a high impedance due to the emitter follower configuration. This is desirable to avoid overloading the source of the input signal. Transistor 29 operates as a feedback amplifier and is so connected and arranged with the transistor 26 that the input and feedback signals are mixed in the differential amplifier effecting isolation of the distributed network 10 from the signal input. Transistor 34, also functioning as an emitter follower, provides a low driving impedance for the distributed network 10. Minimum feedback will occur at the frequency of highest attenuation of network 10 thereby providing maximum gain through the amplifier at that frequency, and proportionately lower gains at other frequencies.

An input signal at the correct frequency will cause amplifier transistor 26 to operate to place a positive signal on the emitter of feedback transistor 29, thereby reducing the signal from transistor 29 which is in differential input relation to transistor 26. Thus, transistor 34 passes the amplified signal to the output. When the input signal is at a frequency out of the bandpass frequency of the amplifier, the signal appearing at terminal 15 of the input of network 10 is passed to the base of feedback transistor 29, due to the low attenuation of the network at frequencies outside of the bandpass frequencies. This signal opposes the signal at transistor 26 due to the differential arrangement of transistors 26 and 29 so as to reduce the gain delivered to transistor 34, and thereby reduce the gain at the output.

The term "narrow bandwidth amplifier" as used herein means one which has decibel-to-frequency gain characteristics plotted as having a single peak at the desired center frequency $f_0$ and sloping downwardly to at least 3 decibels down from the maximum gain. The gain is therefore maximum at center frequency and attenuated at all other frequencies.

FIG. 5 depicts graphical results of the gain for an amplifier constructed in accordance with the present invention. For an amplifier designed to pass 9.76 megacycles, the gain was down 3 decibles when the signal was off 270 kilocycles and down 6 decibles when the signal was off 440 kilocycles. Thus, with a bandwidth $\Delta f$ of 540 kilocycles at a center frequency $f_0$ of 9.76 megacycles, the gain was reduced by 3 decibels, thereby providing a Q ratio between $f_0$ and $\Delta f$ of about 18.

In standard nomenclature, the bandwidth of a filter or bandpass amplifier is generally measured at 3 decibels down, and as the Q ratio between $f_0$ and $\Delta f$ increases, the bandwidth is decreased. It is believed that through the practice of the present invention, thin-film amplifiers can be made to provide narrow bandpass characteristics over center frequency ranges between 20 kilocycles and 60 megacycles per second and Q ratios of up to 60 and higher.

Following is a list of specific parameter values that were used in a hybrid thin-film construction of the invention, which specific embodiment when tested provided the graphic results noted above at 9.76 megacycles per second.

Distributed parameter network identical to that specifically set forth in the above description:

| | | |
|---|---|---|
| Transistors 26, 29 and 34 | | 2N918 |
| Resistor 20 | ohms | Approx. 40 |
| Resistor 24 | do | 15,000 |
| Resistor 25 | do | 10,000 |
| Resistor 27 | do | 56 |
| Resistor 28 | do | 1,000 |
| Resistor 30 | do | 2,000 |
| Resistor 31 | do | 3,000 |
| Resistor 35 | do | 1,000 |
| Capacitor 32 | picofarads | 1,500 |
| Capacitor 33 | do | 500 |

Obviously, many modifications and variations of the present invention are possible in the light of the above teachings.

We claim:

1. A narrow band amplifier having a negative feedback loop; an insulative substrate; a distributed network deposited on said insulative substrate and in said feedback loop, said network comprising: an elongated layer of electrical resistance material deposited on the substrate having one end wider than the other, the side portions of the layer tapering toward one another in an exponential curve; a pair of metal strips deposited onto the respective end margins of the resistance layer and electrically related to other amplifier circuit elements; a dielectric layer deposited over over the resistance layer; and a conductive layer of similar geometry to that of the resistance layer deposited over the dielectric layer and in substantial registry with the resistance layer, the conductive layer having a portion extending outwardly of the narrow end transversely of the long dimension.

2. An amplifier as in claim 1 further including a strip of resistance material deposited onto the substrate adjacent the outwardly extending portion of the conductive layer and having one end margin in electrical contact with said conductive layer, and a conductive strip deposited onto the opposite end margin of said resistance strip and electrically related to other amplifier circuit elements.

3. An amplifier as in claim 2 in which each of said layers and each of said strips is a thin film.

4. A narrow band amplifier according to claim 1 further including differential amplifier means having a first input means adapted to receive input signals, a second input and an output, said distributed network having narrow band attenuation characteristics and being connected between the output and the second input in negative feedback relation whereby input signals having a frequency range of narrow band attenuation of the distributed network are amplified, said differential amplifier comprising a first solid state amplifier connected to said first input and a feedback amplifier connected to said first solid state amplifier and to said second input.

5. A narrow band amplifier according to claim 4, in which the first solid state amplifier comprises a first transistor having an emitter, a base and a collector, and the feedback amplifier comprises a second transistor having an emitter, a base and a collector, means connecting the base of said second transistor to said first input, means connecting the base of said second transistor to said second input, means connecting the emitter of said first transistor to the emitter of said second transistor, means connecting the collector of said first transistor to one side of a source of potential, a third transistor having an emitter, a base and a collector, means connecting the base of said third transistor to the collector of the second transistor, means connecting the emitter to the third transistor to the output, and means connecting the collector of the third transistor to said one side of said source of potential.

6. A narrow band amplifier according to claim 5 in which said first transistor is connected in emitter-follower relationship and said third transistor is connected in emitter-follower relationship.

7. A narrow band amplifier according to claim 4 in which there is further provided a second solid-state amplifier connected to the output and to the distributed network to provide a low driving impedance for the network.

References Cited

UNITED STATES PATENTS 2,694,185 11/1954 Kodama ............. 333—70

OTHER REFERENCES

Hager: "Network Design of Mecrocircuits," Electronics, Sept. 4, 1959, pp. 44–49.

Howe: "Low-Frequency FGT Amplifier Has Narrow Bandpass," Electronic Design, Jan. 4, 1965, p. 72.

Price et al.: "A Tunable Solid-Circuit Filter Suitable For An I.F. Amplifier," Electronic Engineering, Sept. 1963, pp. 806–812.

Roy et al.: "Notch Filters Using Distributed RC Elements," Proceedings of the IEEE, September, 1966, pp. 1220–1221.

Valley et al.: "Vacuum Tube Amplifiers," McGraw-Hill, New York, 1948, pp. 398–404.

ROY LAKE, *Primary Examiner.*

JAMES B. MULLINS, *Assistant Examiner.*

U.S. Cl. X.R.

330—28, 31, 38, 85, 109; 307—298